(12) United States Patent
Chua et al.

(10) Patent No.: US 10,903,173 B2
(45) Date of Patent: Jan. 26, 2021

(54) PRE-CONDITIONED SUBSTRATE

(71) Applicant: Palo Alto Research Center Incorporated, Palo Alto, CA (US)

(72) Inventors: Christopher L. Chua, San Jose, CA (US); Norine Chang, Menlo Park, CA (US); Gregory Whiting, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 544 days.

(21) Appl. No.: 15/299,385

(22) Filed: Oct. 20, 2016

(65) Prior Publication Data

US 2018/0114761 A1    Apr. 26, 2018

(51) Int. Cl.
*H01L 23/00* (2006.01)
*H01L 23/525* (2006.01)
*H01L 31/02* (2006.01)
*H01L 31/105* (2006.01)
*H03K 17/94* (2006.01)
*H05K 1/02* (2006.01)

(52) U.S. Cl.
CPC ........ *H01L 23/573* (2013.01); *H01L 23/5256* (2013.01); *H01L 23/57* (2013.01); *H01L 31/02019* (2013.01); *H01L 31/105* (2013.01); *H03K 17/94* (2013.01); *H05K 1/0275* (2013.01)

(58) Field of Classification Search
CPC ... H01L 23/57; H01L 23/5256; H01L 23/573; H01L 31/02019; H01L 31/105; H05K 1/0275; B32B 17/00; B32B 17/10137; C03B 23/20; C03B 23/203; C03B 27/00; C03C 15/00; C03C 21/00; C03C 21/001; C03C 21/002; C03C 27/044; C03C 27/06; C03C 27/10; F16B 1/00; H01H 85/0052; H03K 17/94; H03K 19/17768
USPC .......................................... 219/209
See application file for complete search history.

(56) References Cited

U.S. PATENT DOCUMENTS

| | | |
|---|---|---|
| 2,529,210 A | 11/1950 | Butler |
| 3,397,278 A | 8/1968 | Pomerantz |
| 3,601,114 A | 8/1971 | Cook |
| 3,666,967 A | 5/1972 | Keister et al. |
| 3,673,667 A | 7/1972 | Loewenstein et al. |
| 3,882,323 A | 5/1975 | Smolker |
| 4,102,664 A | 7/1978 | Dumbaugh, Jr. |

(Continued)

FOREIGN PATENT DOCUMENTS

| | | |
|---|---|---|
| DE | 102004015546 | 10/2005 |
| WO | WO200143228 | 6/2001 |

OTHER PUBLICATIONS

File History for U.S. Appl. No. 15/220,221 as retrieved from the U.S. Patent and Trademark Office Pair System on 24/13/2018, 140 pages.

(Continued)

*Primary Examiner* — Dana Ross
*Assistant Examiner* — James F Sims, III
(74) *Attorney, Agent, or Firm* — Mueting Raasch Group

(57) ABSTRACT

A self-destructing device includes a frangible substrate having at least one pre-weakened area. A heater is thermally coupled to the frangible substrate proximate to or at the pre-weakened area. When activated, the heater generates heat sufficient to initiate self-destruction of the frangible substrate by fractures that propagate from the pre-weakened area and cause the frangible substrate to break into many pieces.

17 Claims, 15 Drawing Sheets

(56) References Cited

U.S. PATENT DOCUMENTS

| | | | |
|---|---|---|---|
| 4,139,359 | A | 2/1979 | Johnson et al. |
| 4,471,895 | A | 9/1984 | Lisec, Jr. |
| 4,558,622 | A | 12/1985 | Tausheck |
| 4,598,274 | A | 7/1986 | Holmes |
| 4,673,453 | A | 6/1987 | Georgi |
| 4,739,555 | A | 4/1988 | Jurgens |
| 5,374,564 | A | 12/1994 | Bruel |
| 5,584,219 | A | 12/1996 | Dunn et al. |
| 5,791,056 | A | 8/1998 | Messina |
| 6,418,628 | B1 | 7/2002 | Steingass |
| 7,002,517 | B2 | 2/2006 | Noujeim |
| 7,068,254 | B2 | 6/2006 | Yamazaki et al. |
| 7,153,758 | B2 | 12/2006 | Hata et al. |
| 7,554,085 | B2 | 6/2009 | Lee |
| 7,880,248 | B1 | 2/2011 | Pham et al. |
| 7,944,049 | B2 | 5/2011 | Fujii |
| 8,130,072 | B2 | 3/2012 | De Bruyker et al. |
| 8,740,030 | B2 | 6/2014 | Purdy et al. |
| 9,154,138 | B2 | 10/2015 | Limb et al. |
| 9,294,098 | B2 | 3/2016 | Shah et al. |
| 9,356,603 | B2 | 5/2016 | Limb et al. |
| 9,577,047 | B2 | 2/2017 | Chua et al. |
| 9,630,870 | B2 | 4/2017 | Zhao et al. |
| 9,780,044 | B2 | 10/2017 | Limb et al. |
| 9,790,128 | B2 | 10/2017 | Garner et al. |
| 10,012,250 | B2 | 7/2018 | Limb et al. |
| 10,026,579 | B2 | 7/2018 | Whiting et al. |
| 10,026,651 | B1 | 7/2018 | Limb |
| 10,308,543 | B2 | 6/2019 | Lee |
| 10,717,669 | B2 | 7/2020 | Murphy et al. |
| 2003/0089755 | A1 | 5/2003 | Peers-Smith et al. |
| 2004/0031966 | A1 | 2/2004 | Forrest |
| 2004/0222500 | A1 | 11/2004 | Aspar et al. |
| 2005/0061032 | A1 | 3/2005 | Yoshizawa |
| 2005/0082331 | A1 | 4/2005 | Yang |
| 2005/0084679 | A1 | 4/2005 | Sglavo et al. |
| 2005/0176573 | A1 | 8/2005 | Thoma et al. |
| 2006/0138798 | A1 | 6/2006 | Oehrlein |
| 2006/0270190 | A1 | 11/2006 | Nastasi et al. |
| 2007/0113886 | A1 | 5/2007 | Arao et al. |
| 2008/0029195 | A1 | 2/2008 | Lu |
| 2008/0311686 | A1 | 12/2008 | Morral et al. |
| 2009/0086170 | A1 | 4/2009 | El-Ghoroury et al. |
| 2010/0035038 | A1 | 2/2010 | Barefoot et al. |
| 2010/0133641 | A1 | 6/2010 | Kim |
| 2010/0225380 | A1 | 9/2010 | Hsu et al. |
| 2011/0048756 | A1 | 3/2011 | Shi et al. |
| 2011/0089506 | A1 | 4/2011 | Hoofman et al. |
| 2011/0183116 | A1 | 7/2011 | Hung et al. |
| 2012/0052252 | A1 | 3/2012 | Kohli et al. |
| 2012/0135177 | A1 | 5/2012 | Comejo et al. |
| 2012/0135195 | A1 | 5/2012 | Glaesemann et al. |
| 2012/0196071 | A1 | 8/2012 | Comejo et al. |
| 2012/0288676 | A1 | 11/2012 | Sondergard et al. |
| 2013/0037308 | A1 | 2/2013 | Wang et al. |
| 2013/0082383 | A1 | 4/2013 | Aoya |
| 2013/0140649 | A1 | 6/2013 | Rogers et al. |
| 2013/0192305 | A1 | 8/2013 | Black et al. |
| 2013/0273717 | A1 | 10/2013 | Hwang et al. |
| 2014/0091374 | A1 | 4/2014 | Assefa et al. |
| 2014/0103957 | A1 | 4/2014 | Fritz et al. |
| 2014/0266946 | A1 | 9/2014 | Bily et al. |
| 2014/0300520 | A1 | 10/2014 | Nguyen et al. |
| 2014/0323968 | A1 | 10/2014 | Rogers et al. |
| 2015/0001733 | A1 | 1/2015 | Karhade |
| 2015/0044445 | A1 | 2/2015 | Garner et al. |
| 2015/0076677 | A1 | 3/2015 | Ebefors |
| 2015/0089977 | A1 | 4/2015 | Li |
| 2015/0102852 | A1 | 4/2015 | Limb et al. |
| 2015/0121964 | A1 | 5/2015 | Zhao et al. |
| 2015/0229028 | A1 | 8/2015 | Bily et al. |
| 2015/0232369 | A1 | 8/2015 | Marjanovic et al. |
| 2015/0318618 | A1 | 11/2015 | Chen et al. |
| 2015/0348940 | A1 | 12/2015 | Woychik |
| 2015/0358021 | A1 | 12/2015 | Limb et al. |
| 2015/0372389 | A1 | 12/2015 | Chen et al. |
| 2016/0122225 | A1 | 5/2016 | Wada et al. |
| 2016/0137548 | A1 | 5/2016 | Cabral, Jr. et al. |
| 2017/0036942 | A1 | 2/2017 | Abramov et al. |
| 2017/0217818 | A1 | 8/2017 | Dumenil et al. |
| 2017/0292546 | A1 | 10/2017 | Limb et al. |
| 2018/0005963 | A1 | 1/2018 | Limb et al. |
| 2018/0033577 | A1 | 2/2018 | Whiting et al. |
| 2018/0033742 | A1 | 2/2018 | Chua et al. |
| 2018/0114761 | A1 | 4/2018 | Chua et al. |
| 2018/0306218 | A1 | 10/2018 | Limb et al. |
| 2018/0330907 | A1 | 11/2018 | Whiting et al. |
| 2019/0106069 | A1 | 4/2019 | Wheeler et al. |

OTHER PUBLICATIONS

EP Search Report for EP App. No. 17182802.3 dated Dec. 6, 2017, 9 pages.
File History for U.S. Appl. No. 15/220,164 as retrieved from the U.S. Patent and Trademark Office on Nov. 29, 2018, 192 pages.
File History for U.S. Appl. No. 15/220,221 as retrieved from the U.S. Patent and Trademark Office on Nov. 29, 2018, 198 pages.
File History for U.S. Appl. No. 15/726,944 as retrieved from the U.S. Patent and Trademark Office on Nov. 29, 2018, 145 pages.
File History for U.S. Appl. No. 15/689,566 as retrieved from the U.S. Patent and Trademark Office on Nov. 29, 2018, 167 pages.
Limb et al., U.S. Appl. No. 15/726,944, filed Oct. 6, 2017.
EP Search Report dated Jan. 4, 2018 for EP App. No. 17182800.7, 14 pages.
File History for U.S. Appl. No. 15/220,164 as retrieved from the U.S. Patent and Trademark Office on Jan. 16, 2018, 195 pages.
EP Search Report for EP App. No. 17194476.2 dated Apr. 5, 2018, 9 pages.
U.S. Appl. No. 15/629,506, Limb et al.
File History for EP App. No. 17163445.4 as retrieved from the EP Patent Office electronic file system on Feb. 13, 2018, 74 pages.
File History for U.S. Appl. No. 15/220,221 as retrieved from the U.S. Patent and Trademark Office on Feb. 13, 2018, 161 pages.
File History for U.S. Appl. No. 15/092,313 as retrieved from the U.S. Patent and Trademark Office on Feb. 13, 2018, 144 pages.
File History for U.S. Appl. No. 15/629,506 as retrieved from the U.S. Patent and Trademark Office on Feb. 14, 2018, 76 pages.
File History for U.S. Appl. No. 15/092,313 as retrieved from the U.S. Patent and Trademark Office on Jun. 16, 2019, 195 pages.
File History for U.S. Appl. No. 15/629,506 as retrieved from the U.S. Patent and Trademark Office on Mar. 16, 2019, 128 pages.
File History for U.S. Appl. No. 15/726,944 as retrieved from the U.S. Patent and Trademark Office on Jun. 16, 2019, 265 pages.
File History for U.S. Appl. No. 16/025,573 as retrieved from the U.S. Patent and Trademark Office on Mar. 16, 2019, 94 pages.
File History for U.S. Appl. No. 16/033,783 as retrieved from the U.S. Patent and Trademark Office on May 16, 2019, 145 pages.
File History for U.S. Appl. No. 16/033,783 as retrieved from the U.S. Patent and Trademark Office on Jan. 16, 2019, 108 pages.
File History for U.S. Appl. No. 14/796,440 as retrieved from the U.S. Patent and Trademark Office on Oct. 16, 2017, 183 pages.
U.S. Appl. No. 14/796,440, Chua et al.
File History for U.S. Appl. No. 15/981,328.
File History for U.S. Appl. No. 16/273,397.
Office Action from U.S. Appl. No. 16/204,996 dated Sep. 3, 2020, 18 pages.
File History for U.S. Appl. No. 15/981,328 as retrieved from the U.S. Patent and Trademark Office on Jun. 4, 2020, 243 pages.
File History for U.S. Appl. No. 16/207,709 as retrieved from the U.S. Patent and Trademark Office on Jun. 4, 2020, 159 pages.
File History for U.S. Appl. No. 16/257,304 as retrieved from the U.S. Patent and Trademark Office on Jun. 4, 2020, 152 pages.
File History for U.S. Appl. No. 16/273,397 as retrieved from the U.S. Patent and Trademark Office on Jun. 4, 2020, 146 pages.
File History for U.S. Appl. No. 16/433,603 as retrieved from the U.S. Patent and Trademark Office on Jun. 4, 2020, 113 pages.

FIG. 13A
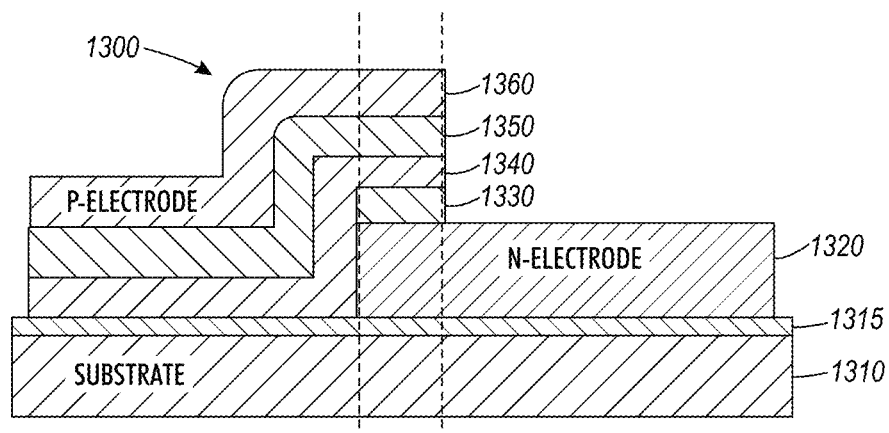
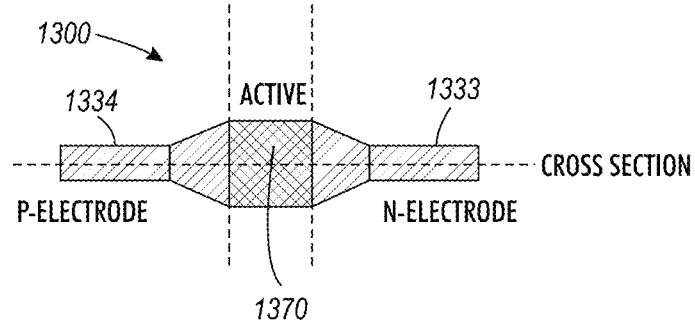
FIG. 13B

PRE-CONDITIONED SUBSTRATE

STATEMENT REGARDING FEDERALLY SPONSORED RESEARCH AND DEVELOPMENT

This invention is based upon work supported by DARPA under Contract No. HR0011-14-C-0013 DARPA-MTO-VAPR-DUST. The Government has certain rights to this invention.

TECHNICAL FIELD

This disclosure relates generally to devices comprising self-destructing substrates and to related methods and devices.

BACKGROUND

Electronic systems capable of physically self-destructing in a controlled, triggerable manner are useful in a variety of applications, such as maintaining security and supply chain integrity.

BRIEF SUMMARY

A self-destructing device includes a frangible substrate having at least one pre-weakened area. A heater is thermally coupled to the frangible substrate proximate to or at the pre-weakened area. When activated, the heater generates heat sufficient to initiate self-destruction of the frangible substrate by fractures that propagate from the pre-weakened area and cause the frangible substrate to break into many pieces.

Some embodiments are directed to self-destructing device comprising a frangible substrate having a pre-weakened area and a heater thermally coupled to the frangible substrate proximate to or at the pre-weakened area. The device further includes a power source and trigger circuitry. The trigger circuitry includes a sensor and a switch. The sensor generates a trigger signal when exposed to a trigger stimulus. The switch couples the power source to the heater when actuated by the trigger signal. When the heater is coupled to the power source, the heater generates heat sufficient to initiate self-destruction of the frangible substrate by fractures propagating from the pre-weakened area and causing the frangible substrate to break into many pieces.

Some embodiments are directed to a method involving a frangible substrate. The method includes disposing a heater on a frangible substrate such that the heater is thermally coupled to the frangible substrate. The frangible substrate is pre-conditioned at or proximate to a location of the heater to form a pre-weakened area. The pre-conditioning weakens the substrate at the pre-weakened area without causing self-destruction of the frangible substrate such that subsequent application of a predetermined level of energy to the heater causes the self-destruction of the frangible substrate due to fractures to propagating from the pre-weakened area.

These and other aspects of the present application will be apparent from the detailed description below. In no event, however, should the above summaries be construed as limitations on the claimed subject matter, which subject matter is defined solely by the attached claims.

BRIEF DESCRIPTION OF DRAWINGS

FIG. 13A is a cross sectional view of a p-i-n photodiode that may be used as the sensor of a self-destructing device in accordance with some embodiments.

FIG. 13B is a top view of the p-i-n photodiode of FIG. 13A;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Embodiments disclosed herein relate to devices capable of self-destructing by fracturing into small pieces in a controlled, triggerable manner. Devices and methods disclosed herein are useful in a variety of applications such as government security and supply chain integrity. Devices discussed herein are capable of self-destructing into small pieces when a heater is activated by an energy source, e.g., a source supplying optical, electrical, microwave energy. Activation of the heater can consume a substantial amount of energy when causing the substrate to self-destruct. Embodiments described herein involve a device that includes a frangible substrate having a pre-weakened area that reduces the energy required to cause the substrate to self-destruct.

Figure 1:
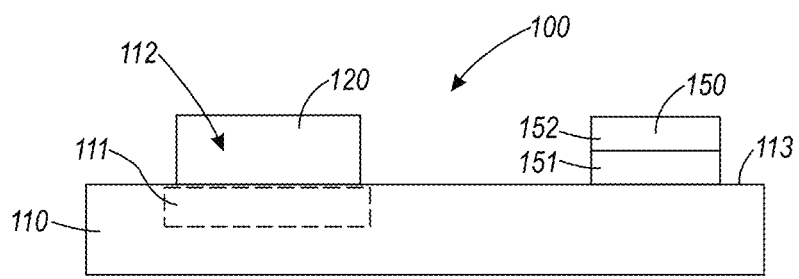
FIG. 1 shows self-destructing device configured to self-destruct in response to a exposure to energy in accordance with some embodiments.

FIG. 1 shows self-destructing device 100 configured to self-destruct in response to exposure to an energy source. Self-destructing device 100 includes a frangible substrate 110 having at least one previously damaged area 111. A heater 120 is thermally coupled to the frangible substrate 110 at a location 112 at or proximate to the damaged area 111. One or more components 150, e.g., electronic circuits, may also be disposed on the substrate 110. In some embodiments, the heater is a resistive conductive film that is energized by flowing electrical current. In some embodiments, the heater 120 may a radio-frequency absorber energized by radio-frequency source. In yet other embodiments, the heater 120 may an optical absorber energized by a laser beam. In some embodiments, the heater 120 can be a resistive conductive film comprising a thin film fuse that breaks when the temperature of the thin film fuse reaches a sufficiently high value.

Figure 2:
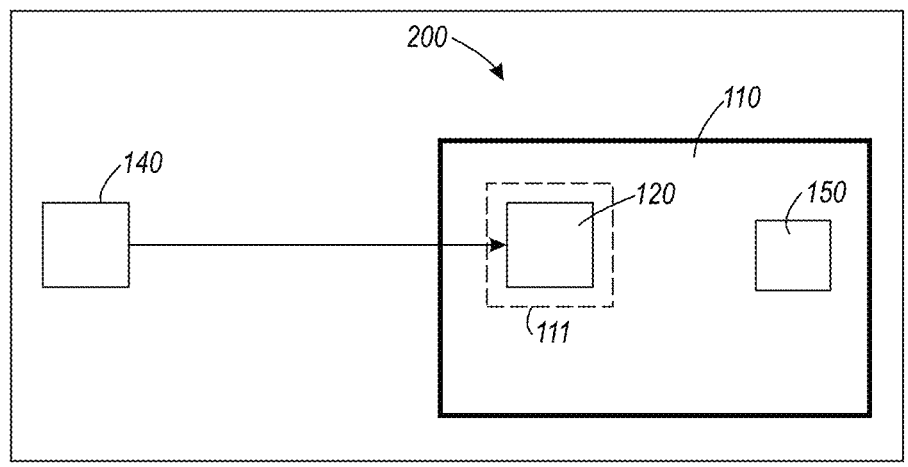
FIG. 2 shows a self-destructing device that also includes an energy source for activating the heater in accordance with some embodiments.

FIG. 2 shows a self-destructing device 200 that also includes an energy source 140. The energy source 140 may supply optical, microwave, and/or electrical energy to activate the heater. When activated by the energy source 140, the heater 120 absorbs or generates heat and transfers the heat to the frangible substrate 110. The heat from the heater 120 is sufficient to cause the frangible substrate 110 with the pre-weakened area 111 to self-destruct by fracturing into many small pieces, e.g., using a mechanism similar to that captured in a Prince Rupert's Drop. In some embodiments, the fracture dynamics are designed so that the frangible substrate 110 self-destructs by fracturing into small particles such that most of the particles have length, width, and height dimensions of less than about 900 µm, less than about 500 µm, or even less than about 100 µm. In addition, the released potential energy during self-destruction of the substrate 110 can be sufficient to also cause the heater 120, components 150 and any other structures disposed on substrate 110 to fracture into small pieces.

The pre-weakened area 111 is configured such that the threshold energy imparted to the heater 120 that initiates self-destruction of the frangible substrate 110 having the pre-weakened area 111 may be less than about 60%, or less than about 40% but greater than 5% of a threshold energy that initiates self-destruction of a similar frangible substrate without the pre-weakened area.

Figure 3A:
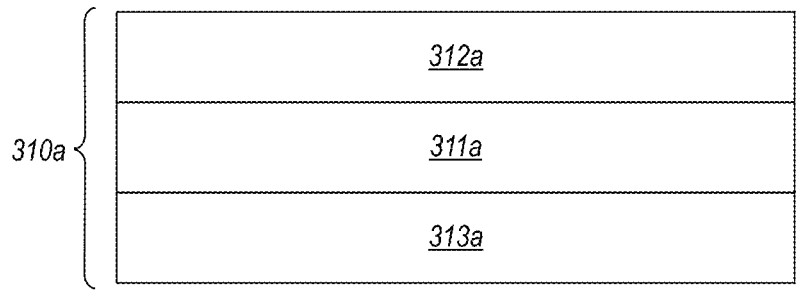
FIGS. 3A through 3C are cross sectional diagrams of frangible substrates in accordance with some embodiments.

In some embodiments, as shown in the cross sectional diagram of FIG. 3A, frangible substrate 310a includes at least one glass structure including a first glass material having a first coefficient of thermal expansion (CTE) value, and multiple second glass structures 312a, 313a respectively including one or more different (second) glass materials respectively having a second CTE value, where the second CTE value is different from the first CTE value. For example thermally tempered glass substrate 310a includes a glass structure 311a disposed between two glass structures 312a and 313a, where glass structure 311a comprises a different glass material having a different CTE value than the glass material from which glass structures 312a and 313a are formed.

Figure 3B:
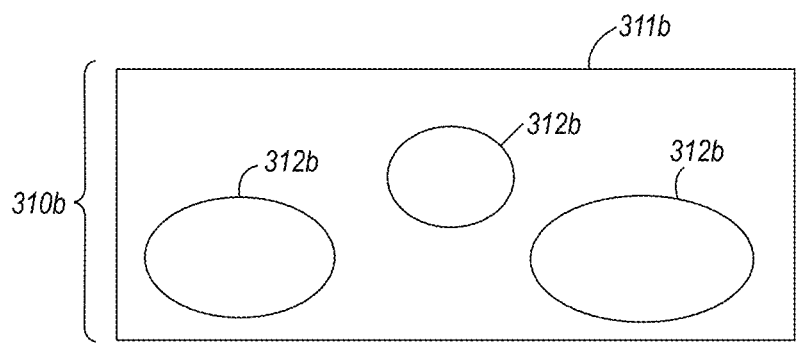

In some embodiments, as shown in the cross sectional diagram of FIG. 3B, a frangible substrate 310b comprises thermally tempered glass. The thermally tempered glass substrate 310b includes second glass structures 312b disposed in a first glass structure 311b, where glass structure 311b comprises a different glass material than that of glass structures 312b. The fabrication of such thermally tempered glass substrates is described in U.S. Pub. App. No. 2015/0358021, which is incorporated herein by reference in its entirety.

Figure 3C:
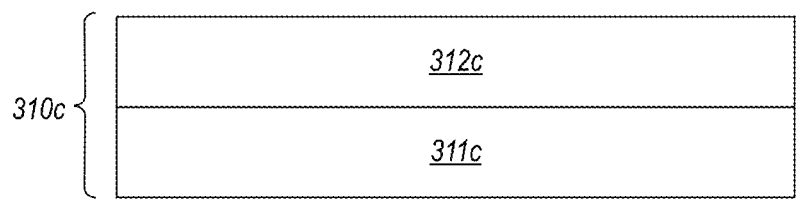

In some embodiments, a frangible substrate 310c comprises stress-engineered tensile 311c and compressive 312c layers that are operably attached together as illustrated in the cross sectional diagram of FIG. 3C. The at least one tensile stress layer 311c has a residual tensile stress and the at least one compressive stress layer 312c has a residual compressive stress. Tensile stress layer 311c and compressive stress layer 312c (collectively referred to herein as "stress-engineered layers") can be operably integrally connected together such that residual tensile and compressive stresses are self-equilibrating and produce a stress gradient. The stress-engineered layers 311c, 312c may be fabricated either by post-treating a substrate material using strategies similar to glass tempering (e.g., by way of heat or chemical treatment), or by depositing the substrate layers using, for example chemical, vapor deposition techniques in which the deposition parameters (i.e., temperature, pressure, chemistry) are varied such that the layers collectively contain a significant inbuilt stress gradient. Fabrication of stress-engineered layers is described in in the manner described in U.S. Pat. No. 9,154,138 which is incorporated herein by reference in its entirety. Note that the arrangement of stress-engineered layers 311c, 312c indicated in FIG. 3C is not intended to be limiting in that one or more stressed and/or non-frangible substrate layers may be disposed on and/or between the two stress-engineered layers 311c, 312c.

In yet another embodiment, a substrate may comprise an ion-exchange treated glass substrate or interposer fabricated in the manner described in U.S. patent application Ser. No. 14/694,132 filed Apr. 23, 2015 and entitled "Transient Electronic Device With Ion-Exchanged Glass Treated Interposer" which is also incorporated herein by reference in its entirety.

Returning now to FIG. 1, in some embodiments, at least one of the one or more components 150 may comprise electronic elements 152 fabricated on a semiconductor base layer 151 such as a silicon on insulator (SOI) layer or an integrated circuit (IC) die/chip that is attached to a surface 113 of the frangible substrate 110. In some embodiments, components 150 may comprise electronic circuits 152 fabricated on a suitable semiconductor (base) layer 151 using existing IC fabrication techniques, e.g., CMOS.

A device comprising a self-destructing substrate as discussed herein may be employed to also destroy an IC or other component for purposes of protecting the environment or maintaining confidentiality, e.g., preventing tampering and/or unauthorized reverse engineering of the IC or component. Fabricating an electronic component 150 on a frangible substrate 110 facilitates forming the components 150 using low cost manufacturing techniques, and facilitates reliable elimination of the components 150 by way of causing self-destruction of the frangible substrate 110. The components 150 may be configured to perform a prescribed useful function (e.g., sensor operations) up until the destruction of the frangible substrate 110 and components 150.

In some embodiments, the semiconductor layer 151 is a silicon "chip" (die) upon which electronic elements 152 are fabricated, and then the semiconductor layer 151 is fixedly attached to the frangible substrate 110 using a die bonding technique, such as anodic bonding, or by way of sealing glass, that assures coincident destruction of electronic elements 152 with frangible substrate 110. In some embodiments, at least one component 150 includes electronic elements 152 configured to form an IC device using standard silicon-on-insulator (SOI) fabrication techniques, e.g., such that the at least one component 150 is implemented as an SOI integrated circuit structure. In another embodiment, electronic elements 152 may be fabricated on an IC die that is "thinned" (e.g., subjected to chemical mechanical polishing) before the IC die is bonded to the surface 113.

Figure 4:
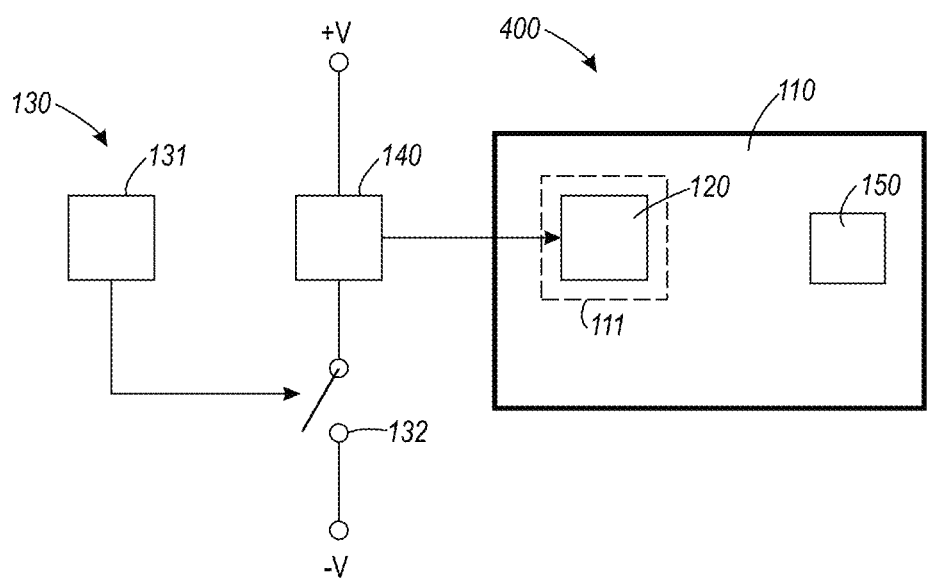
FIG. 4 is a diagram illustrating a self-destructing device that includes an energy source and trigger circuitry in accordance with some embodiments.

As shown in FIG. 4, in some embodiments, a self-destructing device 400 includes an energy source 140 and trigger circuitry 130 comprising a sensor 131 and a switch 132. When the sensor 131 senses the trigger stimuli, the sensor 131 generates a trigger signal that actuates the switch 132 to turn on an energy source 140 that activates the heater 120. As shown in FIG. 4, in response to sensing trigger stimulus, the sensor 131 actuates the switch 132. Actuation of the switch 132 connects the energy source 140 to a power circuit between +V, −V. The energy source is turned on and imparts energy to the heater. As previously discussed, the energy source 140 may be an optical source, RF source, an electrical current source, or other type of energy source.

The sensor 131 may be configured to sense to a variety of trigger stimuli, such as electromagnetic radiation (e.g., radio frequency (RF) radiation, infrared (IR radiation), visible light, ultraviolet (UV) radiation, x-ray radiation, etc.), vibration, a chemical, vapor, gas, sound, temperature, time, moisture, an environmental condition, etc. For embodiments in which the trigger stimulus is visible light, the sensor may be configured to generate the trigger signal in response to exposure to broadband light, such as sunlight or room light, or narrow band light, such as green, red, or blue visible light. For example, the green, red or blue light may be produced by a laser.

In some embodiments, the sensor 131 is configured to detect a tampering event. For example, the tampering event can be detected when the device is exposed to a chemical used for removal of a package cover, the device is vibrated above a threshold vibration, and/or snooping with x-rays that occurs.

In some embodiments, the sensor 131 senses time from a clock. When a timer goes off, an electrical trigger signal is generated to trigger the switch 132.

Figure 5:
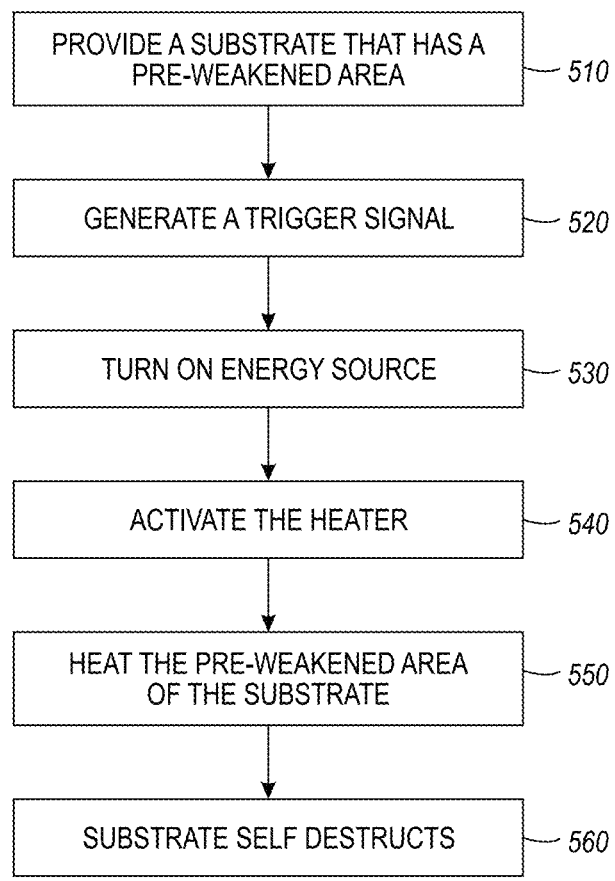
FIG. 5 is a flow diagram illustrating a method of using the self-destructing device of FIG. 4

FIG. 5 is a flow diagram illustrating a method of using the self-destructing device 400 shown in FIG. 4. A pre-weakened frangible substrate is provided 510, the pre-weakened frangible substrate having one or more pre-weakened areas at or near a location of a heater disposed on the frangible substrate. The frangible substrate is damaged at the pre-weakened areas, but is still intact. A trigger signal is generated 520 in response to a trigger stimulus. The trigger signal turns on 530 the energy source that activates 540 the heater. The heater heats 550 at least a portion of the pre-weakened area of the frangible substrate. The heating of the frangible substrate produces a rapid release of stored mechanical energy via substrate fracture causing the frangible substrate to self-destruct 560 by fracturing into many small pieces. Self-destruction of the frangible substrate may also cause the heater and/or other components disposed on the frangible substrate to self-destruct by fracturing into many small pieces. In some embodiments, a subsequent cooling after the heating stage initiates the propagating fractures in the frangible substrate that causes the frangible substrate to self-destruct.

Referring again to FIG. 4, in some embodiments, the pre-conditioning of the frangible substrate 110 may be accomplished by a first type of energy and the self-destruction of the substrate 110 is caused by a second type of energy. In various embodiments, the damaged area 111 of the frangible substrate 110 may be chemically, optically, mechanically, and/or thermally pre-weakened prior to placement of the heater 120 on the frangible substrate 110. For example, the frangible substrate 110 may be optically pre-weakened in the pre-weakened area by one or more of laser ablation and laser drilling, wherein the surface 113 of the frangible substrate 110 is exposed to an intense laser beam or to a controlled laser pulse. The frangible substrate 110 may be mechanically pre-weakened in the pre-weakened area 111 by one or more of controlled mechanical contact, e.g., an impact or physical removal of material from the frangible substrate 110, by scoring, machining, and/or abrasion of the surface 113 of the frangible substrate 110. The frangible substrate 110 may be chemically pre-weakened in the pre-weakened area 111 by controlled exposure of the frangible substrate 110 to one or more chemicals, e.g., liquids, gasses, and/or plasma, that etch and/or pit the frangible substrate 110. The frangible substrate 110 may be pre-weakened in the pre-weakened area 111 by controlled exposure to of the frangible substrate 110 to an electron beam, an electrical current and/or an electrical voltage. The frangible substrate 110 may be thermally damaged at the pre-weakened area 111 by controlled exposure of the frangible substrate 110 to heat prior to and/or after placement of the heater 120 on the frangible substrate 110. The frangible substrate may be pre-conditioned by forming pits, holes, and/or patterns on the substrate by one or more of chemical etching, plasma etching, ion milling, physical machining, and laser ablating the frangible substrate.

After placement of the heater 120, an energy source, e.g., an optical, electrical, radio frequency and/or microwave energy source, is triggered that activates the heater 120, causing the heater to heats at least a portion of the pre-weakened area 111. Heating of the pre-weakened area leads to the self-destruction of the frangible substrate 110 as discussed herein. The heater 120 heats at least a portion of the pre-weakened area 111 to a threshold level sufficient to cause the substrate to self-destruct. For example, the heating to the threshold level may involve heating the pre-weakened frangible substrate 110 to a predetermined temperature for a predetermined period of time. Heating the frangible substrate 110 to the threshold level produces propagating fractures in the frangible substrate 110 that causes the-frangible substrate to self-destruct by breaking apart into many pieces. If additional components, e.g., electronic components 150, are present on the frangible substrate, the additional components are destroyed by fracturing into many pieces along with the substrate.

In some embodiments, the frangible substrate 110 may pre-weakened using the same type of energy that causes self-destruction of the frangible substrate 110. For example, after a resistive heater 120 is disposed on the frangible substrate 110, one or more controlled current pulses from the a current source 140 activates the heater causing heater 120 to heat the substrate 110. The heat caused by the controlled current pulses is sufficient to cause damage to the substrate 110 at or near the location of the heater 120 but is insufficient to cause the substrate 110 to self-destruct. The frangible substrate 110 may be pre-weakened by activating the heater 120 at an energy lower than the threshold energy needed to cause self-destruction of a similar frangible substrate that does not include a damaged area.

After the pre-conditioning step, the resistive heater 120 is again activated by the current source and the heater heats at least a portion of the pre-weakened area, the heat producing propagating fractures in the frangible substrate 100 that cause the frangible substrate 110 to self-destruct by breaking apart into many pieces. If additional components, e.g., electronic components 150, are present on the frangible substrate 110, the additional components 150 may also be destroyed by fracturing into many pieces along with the frangible substrate 110.

In embodiments wherein the heater 120 is a resistive heater, the pre-weakened area 111 may be formed by activating the resistive heater 120 by one or more damaging current pulses, each of the damaging current pulses having a predetermined amplitude and a predetermined duration. The amplitude and/or duration of each damaging current pulse may be the same, or the amplitude and/or duration of one or more of the damaging current pulses may be different from the amplitude and/or duration of one or more other damaging current pulses. In some implementations, the thermal energy generated by the damaging current pulses to damage the frangible substrate 110 in the pre-weakened area 111 may be more than about 40% or more than about 60% but less than about 90% of the threshold energy generated by current pulses that cause a similar frangible substrate without a pre-weakened area to self-destruct. In some implementations, the amplitude and/or time duration of the damaging current pulses may be the same as the amplitude and/or duration of subsequent current pulses that cause the frangible substrate 110 having the damaged area 111 to self-destruct. The number of damaging current pulses used to damage the pre-weakened area 111 may be more than about 40% or more than about 60% but less than about 90% of the number of current pulses cause that cause a similar frangible substrate without a pre-weakened area to self-destruct.

Figure 6:
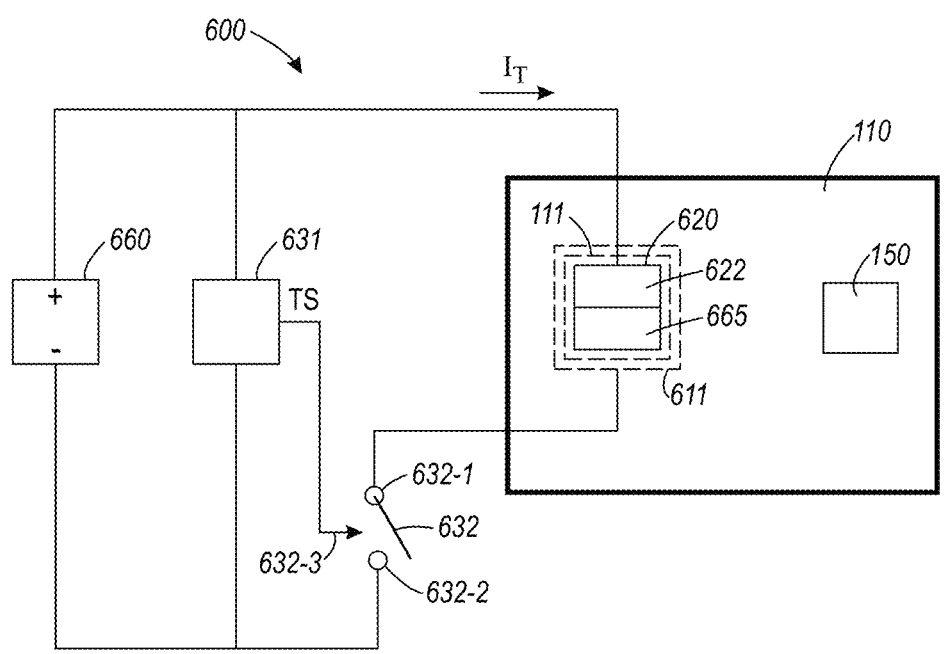
FIG. 6 is a diagram of a self-destructing device comprising a self-limiting resistive heater disposed on a frangible substrate in accordance with some embodiments.

The self-destructing device 600 shown in the block diagram of FIG. 6 comprises a self-limiting resistive heater 620 disposed on a frangible substrate 110 and a trigger mechanism 630 comprising a sensor 631 and a switch element 632. As depicted in FIG. 6, the heater 620 is disposed on a frangible substrate 110 having a pre-weakened area 111 at or proximate to the resistive heater 620. The heater 620 is electrically connected between a first terminal (+) of a power supply 660 and a first terminal 632-1 of the switch element 632. The second terminal 632-2 of the switch element 632 is electrically connected to the second terminal (−) of the power supply 660. A control terminal 632-3 of the switch element 632 is operably disposed to receive an electronic trigger signal TS, which may be generated by an sensor 631 or other control circuitry (not shown). The switch element 632 is actuated (switched from an open/non-conducting state to a closed/conducting state) by asserting trigger signal at the control terminal 632-3 of the switch element 632. Actuation of the switch element 632 initiates a current $I_T$ that flows from the power supply 660 through self-limiting resistive element 620. In one embodiment, self-limiting resistive element 620 includes a resistive portion 662 and a current-limiting portion 665 that are connected in series between the positive and negative terminals of the power supply 660. One or both of the resistive portion 662 and a current-limiting portion 665 operably thermally coupled to frangible glass substrate 110 such that self-limiting resistive element 620 generates heat at a rate that rapidly increases a temperature of a localized region 611 of the substrate 110 wherein the localized region 611 includes at least a portion of the pre-weakened area 111. The current limiting portion 665 of the resistive heater 620 is further configured to independently control (e.g., without requiring an externally-generated control signal) the flow of trigger current $I_T$ by way of terminating the flow of trigger current $I_T$ after localized region 611 receives a sufficiently large amount of the heat generated by self-limiting resistive element 620. In some embodiments, the current-limiting portion 665 of the heater 620 is implemented by a fuse element configured to fail (melt and break) after conducting a predetermined amount of trigger current $I_T$ (e.g., after a predetermined amount of heat is generated by self-limiting resistive element 620). In some embodiments, current-limiting portion 665 may be implemented by other elements/circuits configured to implement the described independent control over trigger current $I_T$, such as a thermistor-based circuit configured to terminate the trigger current flow upon detecting a predetermined temperature level, or a timer-based circuit configured to terminate the trigger current flow a preset time after actuation of switch element 632.

Figure 7:
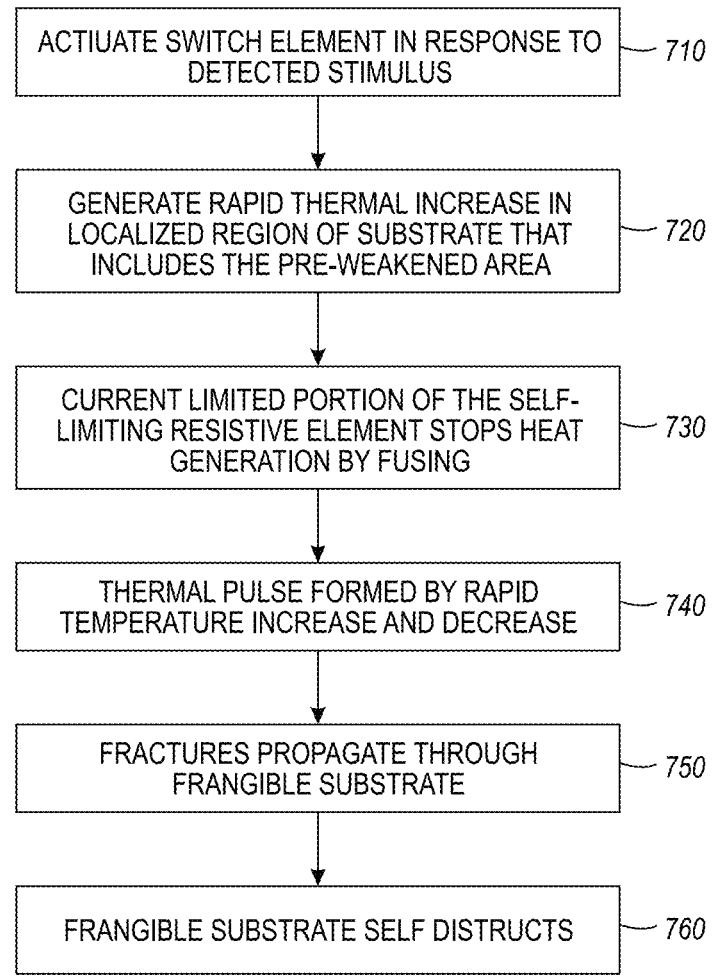
FIG. 7 is a flow diagram showing a generalized method for triggering self-destruction of the self-destructing device illustrated in FIG. 6.

FIG. 7 is a flow diagram showing a generalized method for triggering self-destruction of a self-destructing device 600 as shown in FIG. 6 in accordance with some embodiments. Initially, the device 600 operates normally such that the components 150 disposed on the frangible substrate 110 perform as intended. During normal operation, the switch element 632 is in the open, non-conducting state and no current passes from the power supply 660 through self-limiting resistive element 620, and thus no heat is generated by resistive portion 662. Initially, the localized temperature in region 611 is about the same as the temperature of regions of the frangible substrate 110 adjacent to region 611.

Self-destruction of the frangible substrate is initiated at a time, for example, when a trigger stimulus is detected by a sensor e.g., in response to a wirelessly transmitted light or RF signal), or unauthorized tampering is detected. In response to the trigger stimulus, the trigger signal (TS) is asserted and applied to the control terminal 632-3 of switch element 632, whereby the switch element 632 is actuated 710 to initiate the flow of trigger current $I_T$ through resistive portion 662 and current control portion 665 to ground, whereby resistive portion 662 begins to generate heat that is transmitted through upper surface 111 of frangible substrate 110 into localized region 611 that includes at least a portion of the damaged area 111. The heat causes the localized temperature in the region 611 and pre-weakened area 111 to increase above the initial temperature.

Subsequently, the continued flow of trigger current $I_T$ causes resistive portion 662 to generate heat a rate that rapidly increases 720 the localized temperature in at least a portion of the damaged area 111 toward a predetermined target temperature $T_1$. According to some embodiments, this rapid temperature increase occurs at a rate that causes the temperature in the pre-weakened area 111 to increase at a rate faster than the temperature in regions surrounding the localized region. The heat generated by the self-limiting resistive element 620 enters the pre-weakened area 111 at a faster rate than dissipating heat leaves damaged area 111 into surrounding regions, thereby causing the temperature of the pre-weakened area 111 to rapidly increase from the initial temperature toward the higher target (first) temperature level $T_1$ while surrounding regions remain at a substantially lower temperature.

After the current flows $I_T$ for a period of time, current limiting portion 665 actuates 730 to terminate the generation of heat by way of fusing (breaking), creating an open circuit condition that terminates the flow of current through resistive portion 662. According to another aspect of the invention, self-limiting resistive element 620 is configured such that the termination of generated heat causes a rapid decrease of temperature in the pre-weakened area 111 toward a lower (second) temperature $T_2$ by way of heat dissipating out of damaged area into cooler regions surrounding the region 611. The thermal pulse generated 740 by the rapid temperature increase and rapid temperature decrease described above produces a stress profile in the pre-weakened area 111 of frangible substrate 110 that is sufficient to cause propagation of one or more fractures in the damaged area 111. Subsequently, propagating fractures radiate 750 from the pre-weakened area throughout frangible substrate 110, heater 620, and/or components 150, thereby causing the self-destruction of the device 600.

A threshold level of thermal energy provided by the thermal pulse generates propagating fractures in the device 600 whereas energies provided that are below the threshold level do not generate propagating fractures. The threshold energy of the thermal pulse that generates the propagating fractures that cause the self-destruction of device 600 having the pre-weakened area 111 is less than the threshold energy of the thermal pulse that generates propagating fractures that cause self-destruction of a similar device that does not have a pre-weakened area. For example, the amplitude, time duration, and/or product of the amplitude and time duration of a thermal pulse that creates propagating fractures that cause device 600 to self-destruct may be more than about 10% and less than about 60% or less than about 40% of the amplitude, time duration, and/or product of the amplitude and time duration of a thermal pulse that generates fractures in a similar device that does not include a damaged area.

Figure 8:
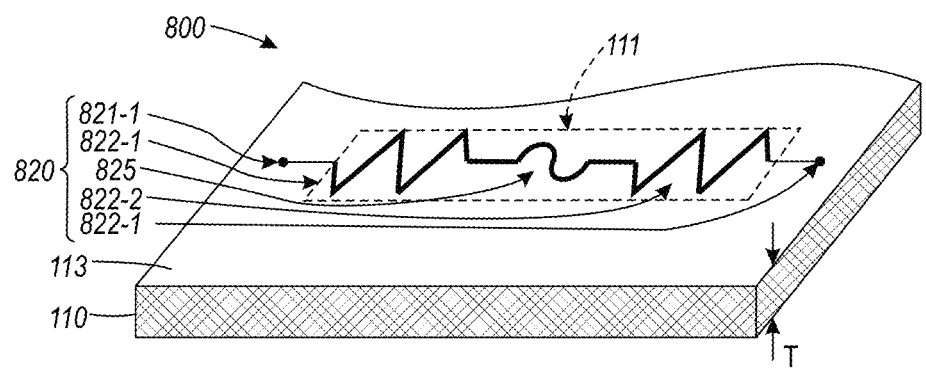
FIG. 8 is a perspective view showing a portion of a self-destructing device having a self-limiting resistive element comprising a fuse-type current-limiting portion connected in series between two resistive portions in accordance with some embodiments.

FIG. 8 is a perspective view showing a portion of a self-destructing device 800 having a self-limiting resistive element 820 comprising a fuse-type current-limiting portion 825 connected in series between two (first and second) resistor structures (resistive portions) 822-1 and 822-2, which are respectively connected to opposing (first and second) terminals 821-1, 821-2 and disposed over pre-weakened area 111. When operably connected together, terminal 821-1 is coupled to a first terminal of a power source (not shown) and terminal 821-2 is coupled by way of a switch element (not shown) to a second terminal of the power source. In some embodiments, resistor structures 822-1, 822-2 and fuse-type current-limiting portion 825 are produced by depositing a single (common) resistive material (e.g., one or more of magnesium, copper, tungsten, aluminum, molybdenum and chrome) directly onto upper surface 113 of frangible substrate 110. The resistive material is sufficiently conductive and adheres to upper surface 113 of frangible substrate 110 well enough that heat generated by resistive portions 822-1, 822-2 and current-limiting portion 825 is transferred efficiently into pre-weakened area 111 during the rapid heating process of a thermal pulse. The resistive material is printed, etched or otherwise patterned such that resistor structures 822-1, 822-2 respectively comprise relatively large structures and fuse-type current-limiting portion 825 comprises a relatively narrow thin structure configured to function as a fuse element. When a sufficiently large current passes between terminals 821-1, 821-2, resistor structures 822-1, 822-2 and current-limiting portion 825 undergo resistive heating, but its relatively narrow cross-section causes current-limiting portion 825 to produce a higher temperature, which is sufficient to cause melting and breakage when subjected to a suitable trigger current. Implementing current-limiting portion 845 using a fuse-type current-limiting portion (fuse element) provides a low-cost, simple and highly reliable structure for independently controlling the amount of heat generated by self-limiting resistive element 820 during the rapid heating process of a thermal pulse, and reliably produces an open circuit condition (i.e., by way of melting/breaking) that terminates flow of trigger current through resistor structures 822-1 and 822-2 at the start of the rapid cooling portion of the thermal pulse.

Figure 9:
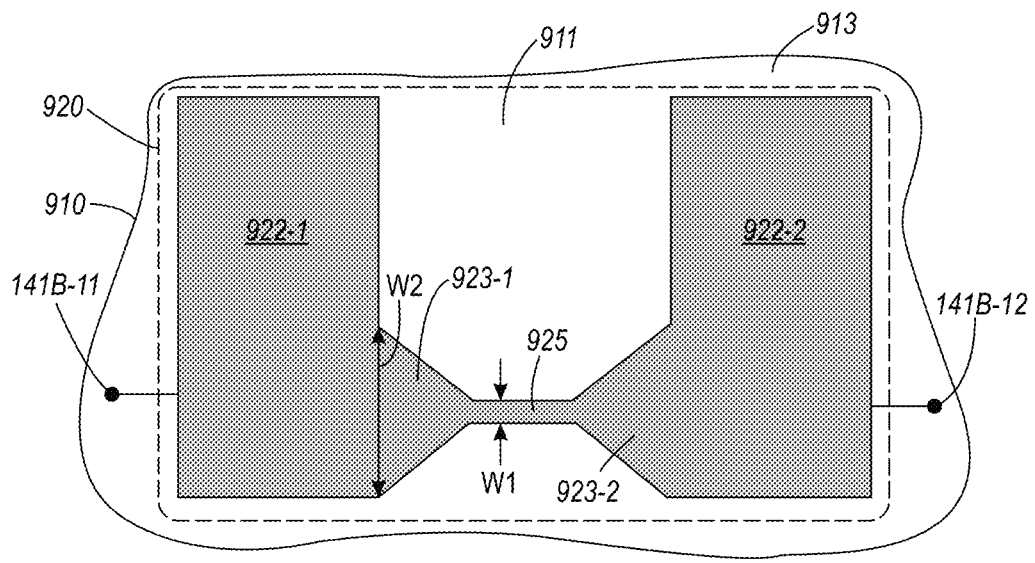
FIGS. 9 and 10 are top plan views showing self-limiting resistive elements that comprise patterned metal layer structures disposed directly on upper surfaces of frangible substrates in accordance with some embodiments.
Figure 10:
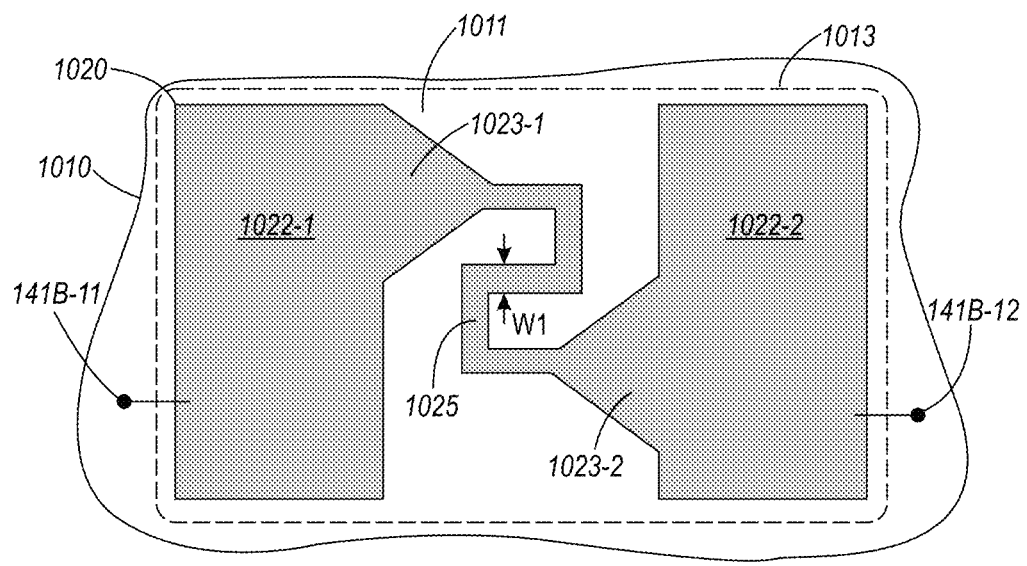

FIGS. 9 and 10 are top plan views showing self-limiting resistive elements 920 and 1020, each resistive element 920, 1020 comprises a patterned metal layer structure disposed directly on upper surfaces 913, 1013 of frangible substrates 910, 1010. Pre-weakened areas 911, 1011 of the frangible substrates 910, 1010 are disposed proximate to the self-limiting resistive elements 920, 1020. Each resistive element 920, 1020 includes a fuse element 925, 1025 connected between tapered sections 923-1, 923-2, 1023-1, 1023-2 of two resistor structures 922-1, 922-2, 1022-1, 1022-2. For example, self-limiting resistive element 920 includes a first resistor structure 922-1 including a tapered section 923-1, a second resistor structure 922-2 including a tapered section 923-2, and a fuse element 925 connected between the tapered ends of tapered sections 923-1, 923-2. Similarly, self-limiting resistive element 1020 includes a first resistor structure 1022-1 including a tapered section 1023-1, a second resistor structure 1022-2 including a tapered section 1023-2, and a fuse element 1025 connected between tapered ends of the tapered sections 1023-1, 1023-2. In each case, fuse elements 925 and 1025 comprise narrow neck structures having widths W1 that are configured to melt and break when subjected to a trigger current. In some embodiments, width W1 is greater than a thickness frangible substrate 110 (e.g., thickness T shown in FIG. 8). For example, in a some embodiments using a 0.25 mm thick frangible substrate, fuse elements 925 and 1025 have widths W1 of at least 0.3 mm. In contrast, the resistor structures of both self-limiting resistive elements (e.g., resistor structure 922-1) can have almost any width (size) W2, although larger resistors require more power and energy from the power source.

As depicted by the embodiments shown in FIGS. 9 and 10, different fuse configurations may be utilized to generate desired thermal pulse characteristics. Specifically, self-limiting resistive elements 920 and 1020 differ in that fuse element 925 comprises a straight rectangular structure extending between tapered ends of the tapered sections 923-1, 923-2, and fuse element 1025 comprises an S-shaped structure extending between tapered ends of tapered sections 1023-1, 1023-2. These different fuse arrangements provide different thermal characteristics, by allowing control over the applied energy and power by tuning the resistance of the resistive elements 920, 1020 as well as tuning the area over which the heat is applied which can impact the time to fragment. Additional information related to self-limiting electrical triggering for initiating fracture of a frangible substrate is discussed in U.S. patent application Ser. No. 15/220,164 filed on Jul. 26, 2016 which is incorporated herein by reference.

Figure 11:
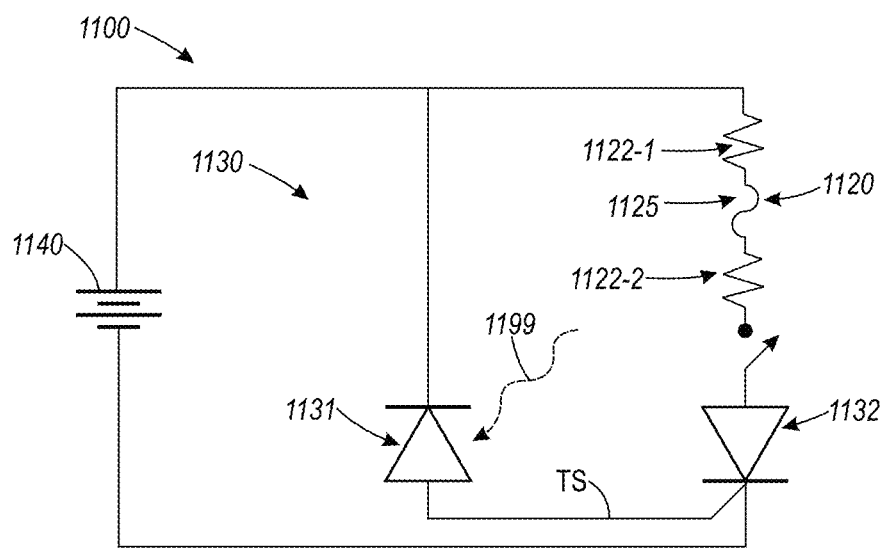
FIG. 11 is a circuit diagram showing a self-destructing device including a remotely (wirelessly) controllable trigger mechanism including a sensor configured to sense the presence and/or amount of a trigger stimulus in accordance with some embodiments.

FIG. 11 is a circuit diagram showing a self-destructing device 1100 including a remotely (wirelessly) controllable trigger mechanism 1130 including a sensor 1131 configured to sense the presence and/or amount of a trigger stimulus 1199 (e.g., presence of light, radio frequency (RF) signal, vibration, acoustic signal, chemical, etc.), and configured to then generate the electronic trigger signal TS used to actuate the switch element 1132. The self-destructing device 1100 includes a resistive heater 1120 thermally coupled to a frangible substrate having a pre-weakened area (not shown). In some embodiments, the resistive heater 1120 comprises a self-limiting resistive element comprising a fuse element 1125 connected between a first resistor structure 1122-1 and a second resistor structure 1122-2 as previously discussed in connection with FIGS. 9 and 10.

In an exemplary embodiment, switch element 1132 is implemented using a silicon controlled rectifier, the trigger stimulus is the presence of light, and sensor 1131 is s a photodiode (or other light-sensitive device) operably coupled to switch element 1132. Current through photodiode 1131 actuates switch element 1132 by way of utilizing the current to cause the silicon controlled rectifier to latch. Latching the silicon controlled rectifier in turn couples the power supply 1140, e.g., a battery, across resistive heater 1120, ultimately causing self-destruction (fragmentation) of the frangible substrate and any included electronics in the manner described above. While remote actuation of the transient electronic device is achieved by the presence of light in this example, other types of trigger stimuli, e.g., the presence of electromagnetic radiation, vibration, sound, chemicals, temperature, etc. may be utilized by replacing photodiode with a suitable sensor for sensing the trigger stimuli. Similarly, while latching is achieved using silicon controlled rectifier in the embodiment illustrated by FIG. 11, other switch elements may also be utilized, such as a latch circuit comprising a single MOSFET transistor or a MOSFET-based multiple-element circuit.

Figure 12A:
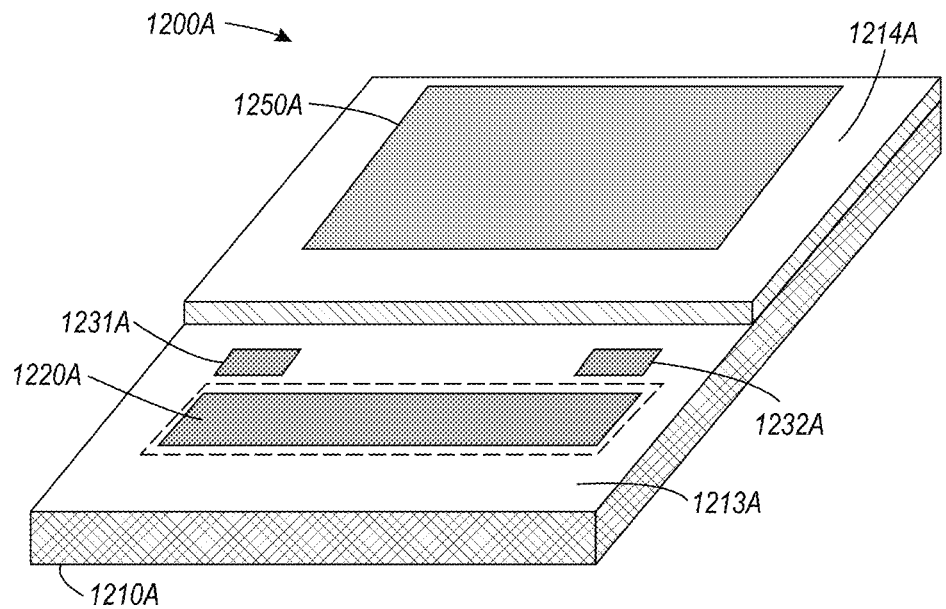
FIGS. 12A and 12B show simplified transient electronic devices in which sensor and/or switch elements are either fabricated or mounted directly on the frangible substrate or are fabricated concurrently with the electronic elements on a semiconductor layer according to some embodiments.
Figure 12B:
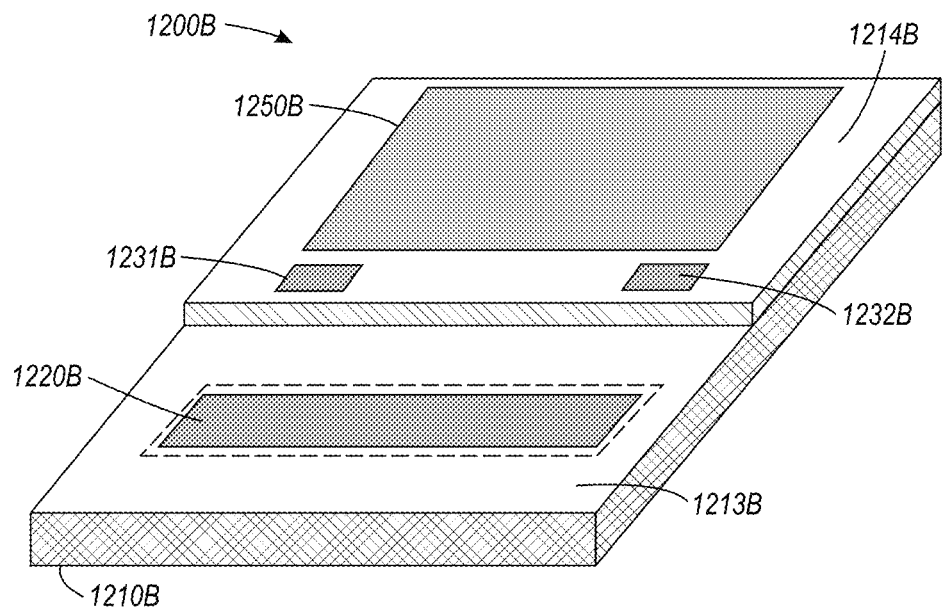

FIGS. 12A and 12B show simplified transient electronic devices 1200a and 1200b according to some embodiments in which sensor and/or switch elements are either fabricated or mounted directly on the frangible substrate, or fabricated concurrently with the electronic elements on a semiconductor layer. For example, FIG. 12A shows a device 1200a in which a sensor 1231a (e.g., a photodiode) and a switch element 1232a (e.g., a silicon controlled rectifier) are implemented by suitable materials printed or patterned directly onto surface 1213a of frangible substrate 1210a. Alternatively, as shown in FIG. 12B device 1200b includes a sensor 1231b and a switch element 1232b fabricated using CMOS fabrication techniques on a semiconductor structure 1214b (e.g., IC chip or SOI layer) on which the electronic elements 1250b are formed. In both embodiments, heater elements 1220a, 1220b are formed directly on frangible substrates 1210a, 1210b, respectively. The frangible substrates 1210a, 1212b include pre-weakened areas 1211a, 1211b at or near the locations of the heater elements 1220a, 1220b. In some embodiments (not shown), one or both of the sensor and switch element may be disposed on a host PC board and connected by way of suitable conductive connection to the heater element 1220a, 1220b.

As discussed above, in many embodiments, the sensor that senses the trigger stimuli is a photodiode, e.g., a pn junction diode or p-i-n diode, and the trigger signal is a photocurrent generated by the photodiode in response to visible light or other electromagnetic radiation. FIG. 13A is a cross sectional view and FIG. 13B is a top view of a p-i-n photodiode sensor 1300 that may be used as the sensor of a self-destructing device in accordance with some embodiments.

The photodiode 1300 comprises a first electrode layer 1320 disposed over the frangible substrate 1310. The first electrode layer 1320 extends over the substrate 1310 to form a first lead 1333 of the photodiode 1300. A first doped layer 1330, e.g., an n-doped amorphous silicon layer, is disposed over the first electrode layer 1320. An intrinsic layer 1340, e.g., an undoped amorphous silicon layer, is disposed between the first doped layer 1330 and an oppositely doped second doped layer 1350, e.g., a p-doped amorphous silicon layer. The first doped layer 1330, intrinsic layer 1340, and second doped layer 1350 form the active region 1370 of the p-i-n diode 1300. A second electrode layer 1360 is disposed over the second doped layer 1350.

The second electrode layer 1360 substantially transmits the stimulus light that turns on the photodiode 1300. For example, the second electrode layer 1360 may have an optical transmittance greater than 50% at wavelengths of the stimulus light. Suitable materials for the second electrode layer 1360 include conductive oxides such as indium tin oxide (ITO), conductive polymers, metal grids, carbon nanotubes (CNT), graphene, wire meshes, thin metal films and/or other conductors that have the requisite optical transmittance. The device 1300 may include an optical filter that narrows the band of wavelengths of light that reach the active region. For example, in some embodiments the second electrode layer, e.g., ITO layer, having a suitable thickness provides an optical filter that substantially attenuates wavelengths of light that are outside a wavelength band of the desired trigger stimulus and substantially passes wavelengths of light that are within the wavelength band of the desired trigger stimulus.

The second electrode layer 1360, second doped layer 1350, and intrinsic layer 1340 extend over the substrate 1310 and form a second lead 1334 of the photodiode 1300. In some embodiments, the first doped layer 1330 is an n-doped layer and comprises n-doped amorphous silicon (a-Si), the second doped layer 1350 is a p-doped layer and comprises p-doped a-Si and/or the intrinsic layer comprises intrinsic a-Si. The example of FIGS. 13A and 13B illustrates a p-i-n diode, however, it will be appreciated that in some embodiments a photodiode may be formed by a pn junction without the intrinsic layer.

In some embodiments the intrinsic layer 1340 of the p-i-n photodetector is a 600 nm-thick intrinsic a-Si deposited by plasma-enhanced chemical vapor deposition (PECVD). The n-layer 1330 is a 120 nm-thick phosphorous-doped a-Si deposited by PECVD, and the p-layer 1350 is a 20 nm-thick boron-doped a-Si deposited by PECVD. This top-side p-layer 1350 is designed to be very thin in order to minimize optical absorption of the light being detected. The n-electrode 1320 is a 200 nm-thick MoCr alloy deposited by sputtering, and the p-electrode 1360 is a 55 nm-thick indium-tin-oxide (ITO) designed with an optical thickness optimal for transmitting the wavelength of light being detected.

In some embodiments, the first 1333 and second 1334 leads electrically connect the active region 1370 of the photodiode 1300 to the switch, power supply and/or heater wherein both the sensor and the switch of the trigger circuitry are disposed on the surface of the frangible substrate 1310.

In some embodiments, the first 1333 and second 1334 leads electrically connect the active region of the photodiode 1300 to a periphery of the substrate 1310. For example, the leads 1333, 1334 may be configured to be connected to external wires that communicate with one or more externally located electronic devices, e.g., the power source and switch, which are not disposed on the substrate 1310. In some embodiments, the first electrode layer 1320 (first lead 1333) and the heater are made of the same materials.

An adhesion promoting surface 1315, such as a barrier layer, may optionally be disposed between the substrate 1310 and the first electrode layer 1320 and or intrinsic layer 1340 of the photodiode 1300 and/or the heater. In one embodiment, the barrier layer comprises a 300 nm-thick PECVD deposited SiO2 barrier layer that enhances film adhesion to the ion-rich surface of the stress-engineered substrate. In some scenarios, the intrinsic layer 1340 (intrinsic a-Si) shown in FIG. 13A may not stick well to the frangible substrate 1310, and in these scenarios the film stack would crack if the barrier layer 1315 is not deposited on the frangible substrate 1310 before the intrinsic layer 1340 is deposited. Without the barrier layer 1315, the frangible substrate 1310 may cause bubbling at the interface between the substrate 1310 and the photodetector layers 1320, 1340. Suitable materials for the barrier layer 1315 include one or more of silicon dioxide (SiO2), silicon nitride (SiN), and silicon oxynitride (SiON). The barrier layer 1315 may have a thickness greater than 300 nm, greater than 500 nm or between 200 and 700 nm, for example.

In some embodiments, the desired trigger stimulus is light from a low power conventional hand-held laser pointer typically used for making presentations. Typical wavelengths are either 532 nm (green) or 650 nm (red). The self-destruct sequence is activated by aiming the laser pointer on the photodetector 1300 from a distant location. The photodetector 1300 may be designed to have a large dynamic response, so it causes the electronic switch to trigger reliably when the self-destruct light trigger stimulus is detected, but not when exposed to normal ambient light. This performance feature is achieved by choosing an appropriate combination of layer thicknesses and active region area.

The area of the active region has to be large enough so it can be easily seen and targeted with a laser pointer from a distance of, for example, up to 15 feet. However, if the area is too big, the photocurrent caused by ambient light could be so large that it triggers the self-destruct process. In some embodiments, the photodetector can have active area size of 3 mm×3 mm in combination with the i and p a-Si layer thickness choices tabulated in Table 1 which provides an exemplary layer structure of an integrated thin film photodetectors sensor at the active region disposed on an ion exchanged glass frangible substrate.

TABLE 1

| Thickness | Layer | Material/process |
| --- | --- | --- |
| 550 Å | p electrode | ITO tuned for green light,/sputtered |
| 200 Å | p doped a-Si | Boron doped/PECVD |
| 6000 Å | intrinsic a-Si | /PECVD |
| 1200 Å | n doped a-Si | Phosphorus doped/PECVD |
| 2000 Å | n electrode | MoCr/sputtered |
| 3000 Å | barrier | Oxide/PECVD |

Ion exchanged glass frangible substrate

Figure 14:
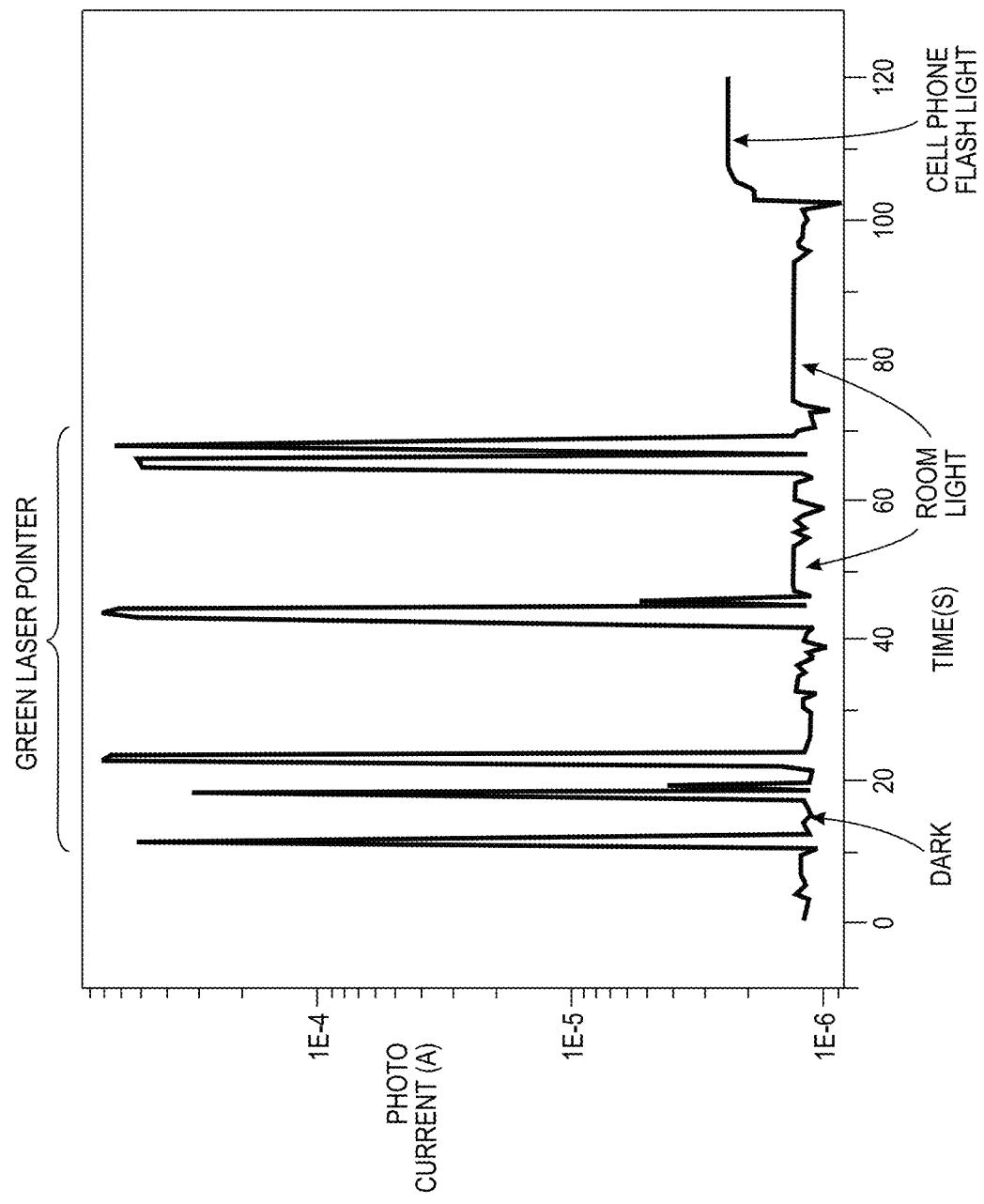
FIG. 14 shows the photocurrent response when the 3 mm×3 mm photodetector is in the dark, exposed to ambient light in a bright fluorescent-lit room, illuminated with a bright cell phone LED flashlight at close proximity, and when illuminated with a typical 5 mW green laser pointer in accordance with some embodiments.

FIG. 14 shows the photocurrent response when the 3 mm×3 mm photodetector is in the dark, exposed to ambient light in a bright fluorescent-lit room, illuminated with a bright cell phone LED flashlight at close proximity, and when illuminated with a typical 5 mW green laser pointer. The contrast in photocurrent response between ambient light and trigger light exceeds 2 orders of magnitude, so the device architecture disclosed herein allows a wide design margin for choosing a threshold photocurrent that determines when the self-destruct switch is triggered. For example, in some embodiments, the self-destruct switch can be designed to trigger to connect the power source to the heater when the photocurrent is about twice the expected maximum photocurrent produced by the ambient environment of the sensor.

Figure 15:
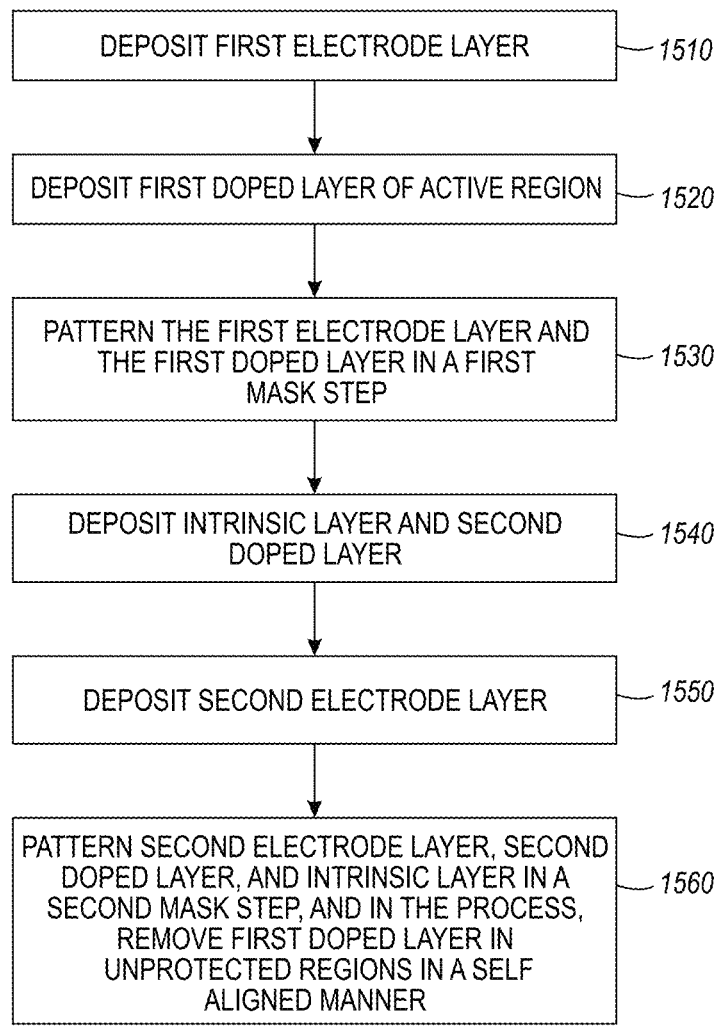
FIG. 15 is a flow diagram that illustrates a process of making the photodetector in accordance with some embodiments.
Figure 16A:
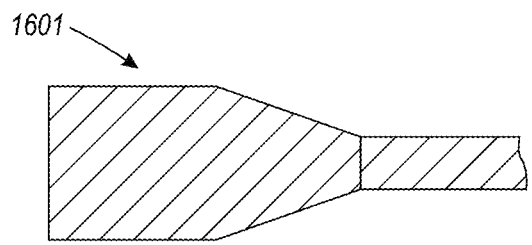
FIGS. 16A and 16B diagrammatically depict top views that illustrate the process of making the photodetector in accordance with some embodiments.
Figure 16B:
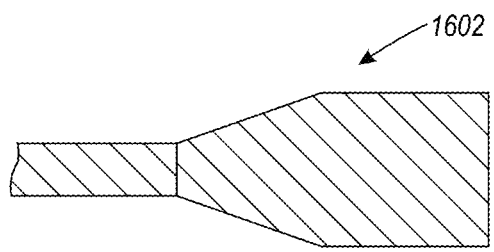

In some embodiments, the photodetector is fabricated so the electrodes/leads are formed together with the active layers in a self-aligned fashion, allowing the complete device, including electrical routing leads that connect the active region to the periphery of the substrate, to be made with not more than two masking layers. FIG. 15 is a flow diagram that illustrates a process of making the photodetector in accordance with some embodiments. FIGS. 16A, 16B, and 13B diagrammatically depict top views that illustrate the process of making the photodetector.

The photodetector may be formed by first depositing an optional barrier layer on a stress-engineered substrate. A first electrode layer is then deposited 1510 on the barrier layer. In some embodiments, the first electrode layer comprises a MoCr alloy that is sputtered on the barrier layer. A first doped semiconductor layer is deposited 1520 on the first electrode layer. The first doped layer may be an n-doped a-Si layer deposited by PECVD, for example. The first doped semiconductor layer and the underlying first electrode layer are then patterned 1530 to form the first electrode region, e.g., by photolithographic patterning of the first electrode layer/first doped layer stack through a first masking step followed by CF4 plasma etching of the first doped layer and chemical wet etching of the first electrode layer.

FIG. 16A shows a top view of the first electrode region 1601 comprising the first electrode/first doped semiconductor layer stack after the first patterning step. An intrinsic layer, e.g., intrinsic a-Si and a second, oppositely doped layer, e.g., p-doped a-Si, are deposited 1540 above the patterned first electrode region, e.g. by PECVD. The second electrode layer is deposited 1550 above the second doped layer. For example, the second electrode layer may comprise ITO deposited by sputtering. The second electrode layer is patterned 1560, e.g., by photolithographic exposure through a second mask followed by chemical etching with HCl acid according to the pattern 1602 in FIG. 16B. The intrinsic and second doped layers are etched, e.g., with CF4 plasma, also using the second mask. This second patterning step not only patterns the second doped and intrinsic layers in the active region, but also selectively removes the remaining portions of the first doped layer above the first electrode layer in the first electrode region formed in the previous patterning step. The end result is the device 1300 shown in FIGS. 13A and 13B, where the electrodes can be formed together with the active region in a self-aligned manner in only two masking steps. In some embodiments the first electrode layer and the heater can be formed simultaneously from the same materials. Additional information related to the formation of sensor and heater structures for initiating fracture of a frangible substrate is discussed in U.S. patent application Ser. No. 15/220,221 filed on Jul. 26, 2016 which is incorporated herein by reference.

Embodiments discussed herein involve a frangible substrate, e.g., a frangible glass substrate, that is pre-weakened at select locations. In some embodiments, the pre-weakening is accomplished by sending a damaging electrical pulse to a heater. For example, the electrical pulse may be applied as part of the fabrication process. The pulse shape, duration, and/or amplitude are controlled so they produce a desired amount of damage to the substrate but are insufficient to initiate self-destruction of the substrate. The amount of energy needed to initiate fracture of a frangible substrate having a pre-weakened area can be substantially reduced when compared to a substantially similar substrate that does not include a pre-weakened area.

EXAMPLES

Examples discussed below employ one or two pre-conditioning current to pre-weaken the substrate. Other embodiments may employ different number of electrical pulses. The number of pulses can be used as a way to control the amount of pre-weakening desired, which could vary depending on the application. Examples 1 and 2 discussed below involve square pulses. However, other pulse shapes such as triangular, sawtooth, or sinusoidal shapes provide additional degrees of freedom for controlling the pre-weakening process. The effect on the substrate of the electrical impulse applied to the heater depends on the overall combination of the number of pulses, the pulse shape, duration, and/or amplitude of the pulses. Thus, one or more of these parameters can all be tuned separately or together to attain the desired degree of damage. In some embodiments, the conditioning pulse applied to the heater can be a voltage pulse, instead of a current pulse. In some embodiments, as discussed above, the electrical pulse to the heater can be initiated by a wireless radio frequency, signal, a microwave signal, or other trigger stimulus. The pre-weakening can be applied at strategic locations other than or in addition to areas directly under the heater.

Example 1

Figure 17:
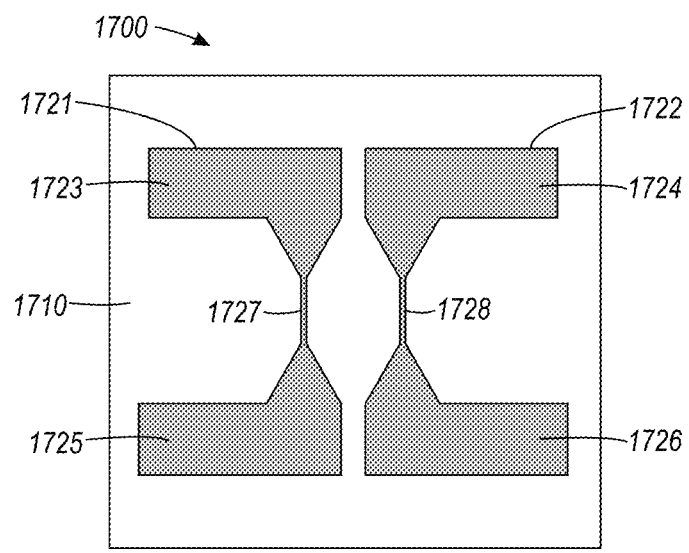
FIG. 17 shows the example device comprising a frangible substrate and two integrated heaters disposed at opposite ends of the substrate in accordance with some embodiments.

In a first example, an integrated thin film resistive heater was used to pre-weaken and to initiate the break-up of a frangible glass substrate. FIG. 17 shows the example device 1700 comprising a frangible substrate 1710 and two integrated heaters 1721, 1722 disposed at opposite ends of the substrate 1710. In this example, the heaters are 3.6 µm-thick Mg thin films deposited by sputtering and patterned to form rectangular strips with bow tie-shaped electrodes. When current is applied across electrodes 1723, 1725 and electrodes 1724, 1726, intense heat is generated at the narrow stripe sections 1727, 1728 of the thin film heaters 1721, 1722. The heat damages the underlying frangible glass substrate 1710 initiating a fracture point that causes the entire frangible glass substrate 1710 to self-destruct along with heaters 1721, 1722.

Figure 18:
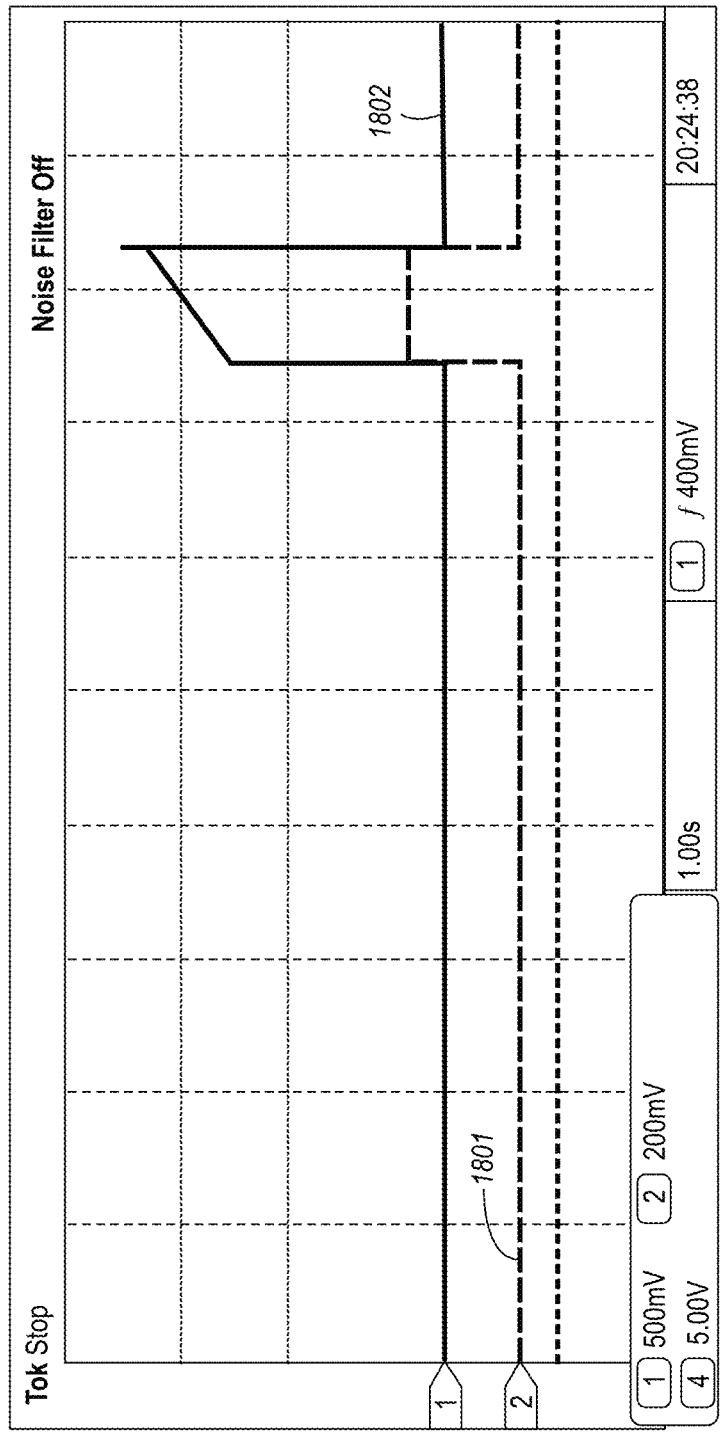
FIG. 18 shows the electrical trace signals of a pulse used to condition a heater shown in FIG. 17 and the voltage across the heater.

Pre-weakening the substrate can reduce the amount of electrical power and energy needed to initiate self-destruction of the substrate 1710. A frangible glass substrate with one or more pre-weakened areas can substantially reduce the energy required to initiate fracture when compared to a similar substrate without one or more pre-weakened areas. In these examples, pre-weakening involves damaging an area with a controlled electrical pulse to the resistive heater as part of the fabrication process. The pulse shape, amplitude, and duration are set so the electrical impulse generates sufficient heat to damage and weaken the target area but does not cause the heater to fuse (break) or cause the underlying frangible glass substrate to self-destruct. t In Example 1, the controlled electrical pulse was set so the shape and amplitude match the parameters that the heater would experience in actual operation. The pulse was then cut short just before the expected time duration when the heater would normally fuse. FIG. 18 shows the electrical trace signals of a pulse used to condition an exemplary 3 mm×0.5 mm heater (corresponding to the heater 1722 in FIG. 17). In this example, the electrical pre-weakening reduced the amount of energy required to initiate fracture by about 23%, from 5.25 Joules to 4.05 Joules. In this example, the conditioning pulse 1801 was single square 3 amp current pulse lasting 0.9 sec. Curve 1802 in FIG. 18 represents the measured voltage across the heater. The voltage increases with pulse duration because the resistance of the Mg film increases as the temperature rises with time.

Figure 19:
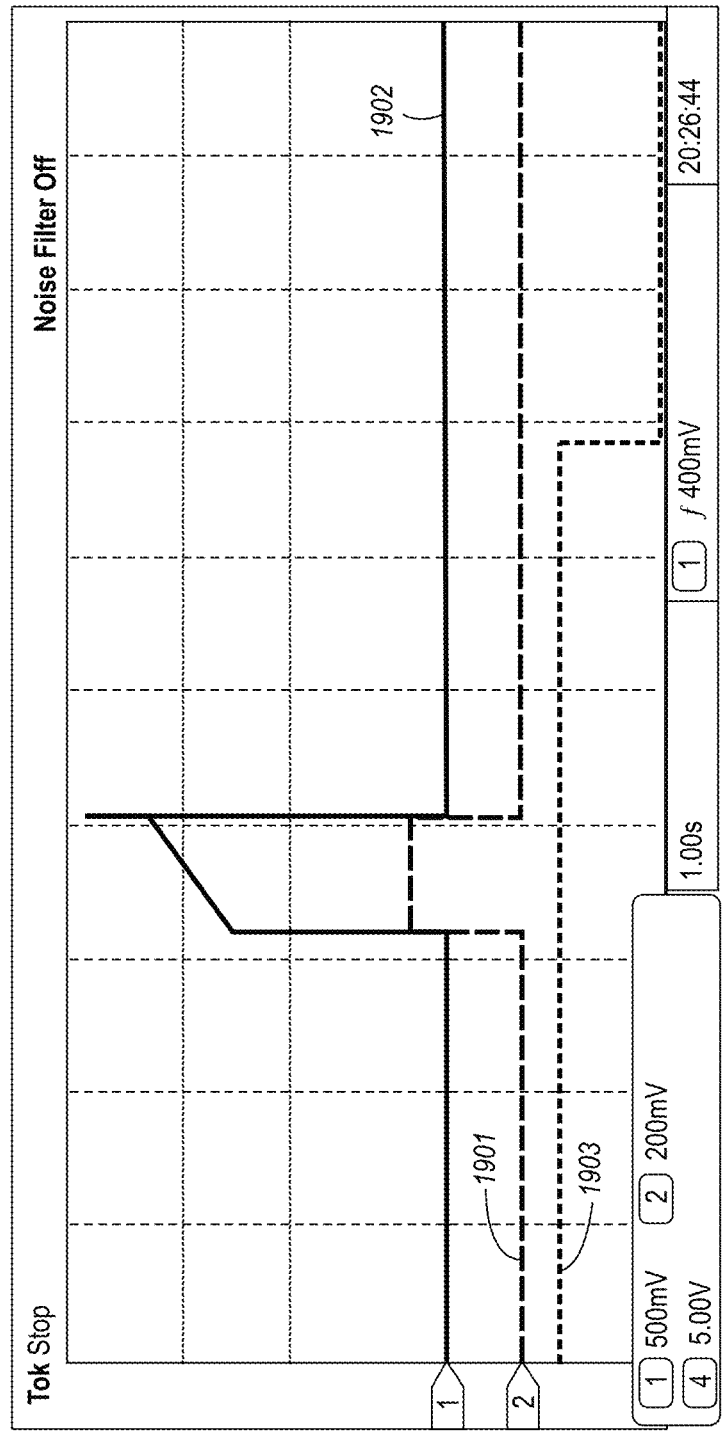
FIG. 19 shows the electrical characteristics of the heater of FIGS. 17 and 18 after the substrate has been pre-weakened when the heater is operated so the applied stimulus causes the heater to fuse and the substrate to fracture.

FIG. 19 shows the electrical characteristics of the pulse-conditioned heater when operated so the applied stimulus causes the heater to fuse and the substrate to fracture. Curve 1901 represents the measured current through the heater, and curve 1902 represents the measured voltage across the heater. Curve 1903 is a monitor signal used for detecting when the substrate fractures. The monitor signal is designed so its output voltage is initially 7V but transitions abruptly to 0V upon substrate disintegration. With 3 amps of trigger current, the heater fuses in 0.78 sec and the glass fractures in 3.53 sec. The total trigger energy consumed is 4.05 Joules. These values compare to a required energy of 5.25 Joules, a heater fusing time of 0.98 sec, and a glass fracture time of 3 sec for an identical system not preconditioned with an electrical pulse.

Example 2

In this example, the device comprised 3 mm long×1 mm wide heaters. Such larger heaters can be used for fracturing thicker frangible glass because thicker glass requires the higher energies that only larger heaters can deliver. For this larger heater, a pre-conditioning pulse current of 4.7 amps, applied twice for durations of 1 sec. per pulse. Once activated with the double pulse impulse, the energy needed to fracture the glass was 5.8 Joules. The corresponding time for the heater to fuse was 0.59 sec, and the time for the glass to fracture was 1.41 sec.

Without the pre-conditioning treatment, applying an identical electrical stimulus did not cause the heater to fuse or the glass to fracture even when held for over 1 sec. The energy needed to initiate fracture was over 9.8 Joules, so the pulse treatment reduced the required energy by over 40% in this example.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. A device comprising:
a frangible substrate having at least one pre-weakened area and a non-pre-weakened area; and
a heater thermally coupled to the frangible substrate proximate to or at the pre-weakened area, wherein, when activated, the heater is configured to provide heat sufficient to initiate self-destruction of the frangible substrate by fractures propagating from the pre-weakened area and causing the frangible substrate to fracture;
wherein one or more electronic circuits are disposed on the non-pre-weakened area of the frangible substrate such that the fractures in the frangible substrate also fracture the electronic circuits.

2. The device of claim 1, wherein the fractures cause the frangible substrate to break into pieces.

3. The device of claim 1, wherein the heater is one of a resistive conductive film, a microwave absorber, and an optical absorber.

4. The device of claim 1, wherein the pre-weakened area is configured such that a threshold energy that initiates the fractures in the pre-weakened area is less than 60% of a threshold energy that initiates fractures in the non-pre-weakened area.

5. The device of claim 1, wherein the pre-weakened area comprises at least one of a thermally, optically, electrically, chemically, or mechanically pre-conditioned area.

6. The device of claim 1, wherein the pre-weakened area comprises pits, holes, or patterns formed on the frangible substrate.

7. The device of claim 1, wherein the frangible substrate comprises glass.

8. The device of claim 1, wherein the frangible substrate includes at least one tensile stress layer having a residual tensile stress and at least one compressive stress layer having a residual compressive stress and being mechanically coupled to the at least one tensile stress layer such that the at least one tensile stress layer and the at least one compressive stress layer are self-equilibrating.

9. The device of claim 2, wherein a majority of the pieces have length, width, and height dimensions of less than 900 µm.

10. The device of claim 1, wherein the pre-weakened area is configured such that a threshold energy that initiates the fractures in the pre-weakened area will not initiate fractures in the non-pre-weakened area.

11. The device of claim 1, wherein the heater comprises a patterned metal layer structure disposed on the frangible substrate.

12. The device of claim 11, wherein the patterned metal layer structure comprises aluminum.

13. A device comprising:
a frangible substrate having a pre-weakened area and a non-pre-weakened area;
a heater thermally coupled to the frangible substrate proximate to or at the pre-weakened area;
a power source; and
trigger circuitry, comprising:
a sensor configured to generate a trigger signal when exposed to a trigger stimulus; and
a switch configured to couple the power source to the heater when actuated by the trigger signal, wherein, when coupled to the power source, the heater is configured to generate heat sufficient to initiate self-destruction of the frangible substrate by fractures propagating from the pre-weakened area and causing the frangible substrate to fracture;
wherein one or more electronic circuits are disposed on the non-pre-weakened area of the frangible substrate such that the fractures in the frangible substrate also fracture the electronic circuits.

14. The device of claim 13, wherein the sensor is configured to sense at least one of radiation, electromagnetic radiation, radio frequency radiation, infrared radiation, ultraviolet radiation, x-ray radiation, visible light, laser light, vibration, a chemical, vapor, gas, sound, temperature, time, moisture, and an environmental condition.

15. The device of claim 13, wherein the sensor is a photodetector configured to generate a trigger signal when exposed to electromagnetic radiation.

16. The device of claim 13, wherein the sensor is a photodiode and the photodiode comprises:
a first electrode layer disposed over a frangible substrate and extending over the frangible substrate to form a first lead of the photodiode;
a first doped layer disposed over the first electrode layer;
a second oppositely doped layer disposed over the first doped layer, the first and second doped layers forming at least a portion of an active region of the photodiode; and
a second electrode layer disposed over the second doped layer, the second doped layer and the second electrode layer extending over the substrate to form a second lead of the photodiode.

17. The device of claim 13, wherein the fractures cause the frangible substrate to break into pieces.

* * * * *